(12) United States Patent
Min et al.

(10) Patent No.: US 7,005,391 B2
(45) Date of Patent: Feb. 28, 2006

(54) METHOD OF MANUFACTURING INORGANIC NANOTUBE

(75) Inventors: Yo-sep Min, Suwon (KR); Eun-ju Bae, Seongnam (KR); Won-bong Choi, Yongin (KR); Young-jin Cho, Incheon (KR); Jung-hyun Lee, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 5 days.

(21) Appl. No.: 10/464,860

(22) Filed: Jun. 19, 2003

(65) Prior Publication Data

US 2005/0202684 A1 Sep. 15, 2005

(30) Foreign Application Priority Data

Jun. 19, 2002 (KR) .................... 2002-0034293

(51) Int. Cl.
 *H01L 21/31* (2006.01)
(52) U.S. Cl. ...................... 438/778; 438/758
(58) Field of Classification Search ............... 438/778
 See application file for complete search history.

(56) References Cited

U.S. PATENT DOCUMENTS

| | | | |
|---|---|---|---|
| 6,027,775 A | 2/2000 | Kasuga et al. | 428/34.1 |
| 6,210,800 B1 | 4/2001 | Nesper et al. | 428/367 |
| 6,482,740 B1 * | 11/2002 | Soininen et al. | 438/686 |
| 6,824,816 B1 * | 11/2004 | Aaltonen et al. | 427/124 |
| 2002/0164420 A1 * | 11/2002 | Derderian et al. | 427/248.1 |
| 2002/0173054 A1 * | 11/2002 | Kin | 438/3 |
| 2003/0194598 A1 * | 10/2003 | Chen | 429/40 |

OTHER PUBLICATIONS

Nature 1999, 402, 273.
Angew Chem., Int. Ed. 1999, 38, 2175.
Nature 1991, 354, 56.
Adv. Mater. 2002, 14, 277.
Appl. Phy. Lett. 2001, 79, 3696.
Nature 2002, 416, 495.
Science 283, 1513 (1999).
Science 287, 622 (2000).
Nature 386, 512 (1999).
Appl. Phys. Lett. 72, 2912 (1998); Science 283, 512 (1999).
Science 286, 2148 (1999).
Science 293, 76, (2001).
Science 284, 1340 (1999).
Science 289, 94 (2000).
Nature 375, 564 (1995).
Science 283, 512, (1999).
JJAP 36, L501 (1997).
Appl. Phys. Let, 73, 3085 (1998).
Chem. Mater 14, 2209, (2002).
Science 277, 1287 (1997).
Langmuir 12, 1441 (1996).
Abstract of 46th International Conference on Electron, Ion and Photom Beam Technology and Nanofabrication, Anaheim CA. 269, (2002).
Ritala et al. Nanotechnology 10 (1999), 19-24.

* cited by examiner

*Primary Examiner*—Thao Phuong Le
(74) *Attorney, Agent, or Firm*—Lee & Morse P.C.

(57) ABSTRACT

A method of manufacturing an inorganic nanotube using a carbon nanotube (CNT) as a template, includes preparing a template on which a CNT or a CNT array is formed, forming an inorganic thin film on the CNT by depositing an inorganic material on the template using atomic layer deposition (ALD), and removing the CNT to obtain an inorganic nanotube or an inorganic nanotube array, respectively.

11 Claims, 11 Drawing Sheets

METHOD OF MANUFACTURING INORGANIC NANOTUBE

BACKGROUND OF THE INVENTION

1. Field of the Invention

The present invention relates to a method of manufacturing an inorganic nanotube or an array of inorganic nanotubes and, more particularly, to a method of manufacturing an inorganic nanotube using a carbon nanotube as a template.

2. Description of the Related Art

With recent development of integrated and compact optical and electronic devices, nano-structured materials and manufacturing methods thereof have been actively researched and developed. Various methods of manufacturing nano-scale rods, wires, tubes, and particles using various materials have been widely studied. However, a method of manufacturing inorganic nanotubes in a systematic array using vapor deposition suitable for manufacturing of nano-scale devices is virtually unknown.

SUMMARY OF THE INVENTION

The present invention provides a method of manufacturing various types of inorganic nanotubes, especially a method of manufacturing an inorganic nanotube using a carbon nanotube as a template.

According to an aspect of the present invention, there is provided a method of manufacturing an inorganic nanotube. The method includes preparing a template on which a carbon nanotube (CNT) or a CNT array is formed; forming an inorganic thin film on the CNT by depositing an inorganic material on the template using atomic layer deposition (ALD); and removing the CNT to obtain an inorganic nanotube or an inorganic nanotube array.

Preferably, preparing the template includes forming a porous material layer on a substrate; and growing a CNT from a pore in the porous material layer.

Preferably, the porous material layer is made of porous alumina.

Preferably, forming the porous material layer includes forming an aluminum thin film on the substrate; and oxidizing the aluminum thin film to form a porous alumina layer.

Preferably, removing the CNT includes ashing and oxidizing the inorganic thin film while supplying oxygen or ozone. Preferably, the inorganic material is ruthenium, and the ruthenium is deposited at a temperature below 300° C. Alternatively, removing the CNT may include etching using plasma in order to remove the CNT without oxidizing the inorganic material.

BRIEF DESCRIPTION OF THE DRAWINGS

The above and other features and advantages of the present invention will become more apparent to those of skill in the art by describing in detail a preferred embodiment thereof with reference to the attached drawings in which.

DETAILED DESCRIPTION OF THE INVENTION

Korean Patent Application No. 2002-34293, filed on Jun. 19, 2002, and entitled: "Method of Manufacturing Inorganic Tubes," is incorporated by reference herein in its entirety.

According to an embodiment of the present invention, a method of manufacturing an inorganic nanotube or an array of inorganic nanotubes uses a carbon nanotube (CNT) or an array of CNTs is used as a template. In other words, a CNT or an array of CNTs is coated with an inorganic thin film for an inorganic nanotube using atomic layer deposition (ALD). Deposition behavior of the inorganic thin film formed using ALD is different on the inner wall and on the outer wall of the CNT. The inorganic thin film formed on the inner wall of the CNT has a sparse micro structure. Accordingly, when the inorganic thin film is processed in an activated oxidation atmosphere such as an oxygen, ozone, or plasma atmosphere, the CNT combusts, and a new second inorganic nanotube or an array of second inorganic nanotubes is formed.

According to a feature of the present invention, a CNT coated with an inorganic material may be manufactured along with a second inorganic nanotube by removing the CNT, which was used as a template for the application.

The present invention uses ALD in order to manufacture an inorganic nanotube, and thus a brief discussion of ALD is provided. Unlike chemical vapor deposition in which a precursor and reaction gas are simultaneously supplied, in ALD, a precursor and reaction gas are separately supplied through a time division by a series of purge processes. In other words, through a series of processes, such as a precursor supply process, a purge process, a reaction gas supply process, and a purge process, a monolayer of the precursor, chemically absorbed to the surface of a substrate, is decomposed due to a chemical reaction with the reaction gas, and thereby forms a thin film having an atomic layer thickness.

Accordingly, the growth rate is self-limiting, and the thickness of the thin film may be accurately controlled by controlling the number of cycles of the purge processes. In addition, deposition is accomplished only when chemically absorbed chemical species react with the reaction gas, and as a result, the growth rate depends on the chemical absorption rate of the precursor on the deposited surface. One of the most important features or advantages of using ALD is that deposition may be performed at a sufficiently low temperature so as not to thermally decompose the precursor. Accordingly, when deposition is performed on a cubic substrate having a very large aspect ratio, the cubic substrate may be completely covered with a deposited layer. Under an ALD condition where the thermal deposition of a precursor is not performed, the growth rate is not influenced by temperature. However, ALD generally requires a precursor or reaction gas having sufficiently high reactivity to induce chemical reaction between absorbed species and the reaction gas on a surface.

In the meantime, a CNT is formed through covalent bond between carbon atoms, so the CNT combusts at a higher temperature than 400° C. due to oxygen. Accordingly, in order to form a thin film on a CNT, deposition may be performed at a low temperature in order to suppress oxidation reactions, or using reactants with weak oxidizing strength, such as water.

Test of ALD Growth Rate of Ruthenium (Ru)

Figure 1:
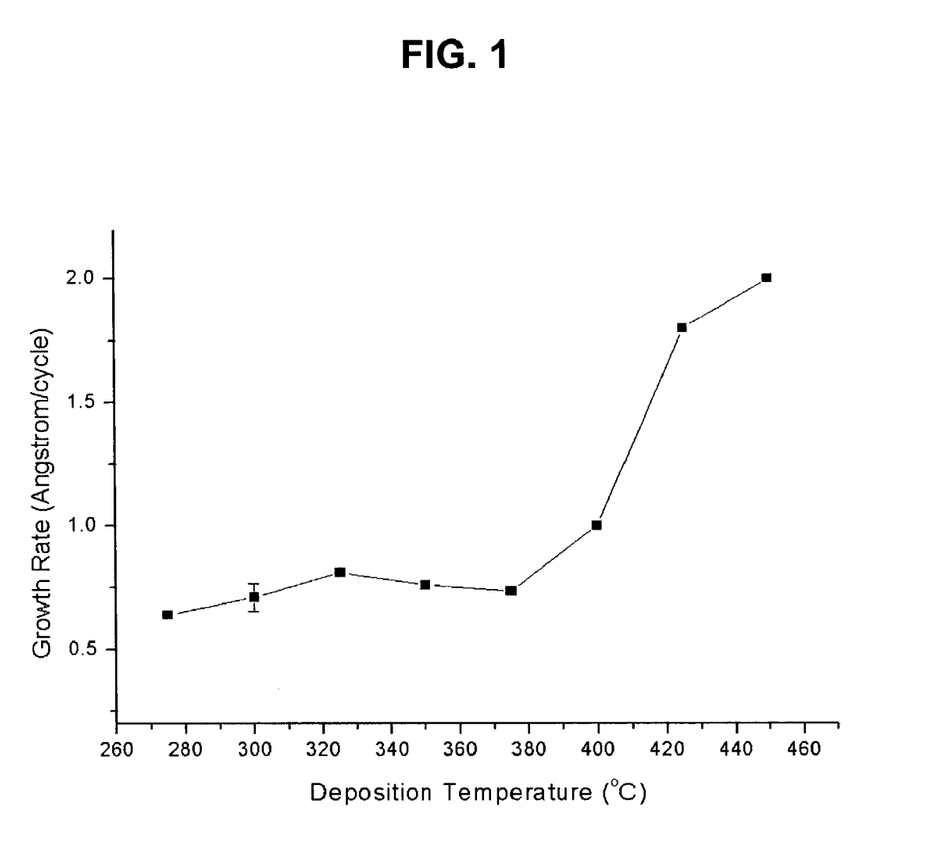
FIG. 1 is a graph showing deposition temperature versus growth rate when a ruthenium (Ru) thin film is formed using atomic layer deposition (ALD)

FIG. 1 shows an ALD growth rate of a Ru thin film, which is used to manufacture a nanotube according to the present invention, per deposition cycle. Here, the substrate was a Si substrate including $SiO_2$.

To form a Ru thin film on a Si substrate, a 0.1 M Ru(od)3 (od=octane-2, 4-dionate)/n-butylacetate solution was supplied as a precursor using Ar carrier gas for 2 seconds at a rate of 150 sccm, and oxygen was supplied as the reaction gas for 2 seconds at a rate of 100 sccm. Purge gas Ar was supplied for 3 seconds after the supply of the precursor and before the supply of the reaction gas. Accordingly, the total time per deposition cycle was adjusted to 10 seconds. ALD was performed at intervals of 25° C. in the range of 275–450° C. As a result, a pure Ru thin film was obtained at a temperature below 350° C., but at a temperature over 400° C., resultants were mainly RuOx. In the higher temperature range of 350–400° C., there is a tendency for increased RuOx formation to occur due to the increase in temperature. Referring to FIG. 1, since deposition through thermal decomposition rarely occurs at a temperature below 375° C., the growth rate is very low, i.e., below 0.1 nm, per deposition cycle.

Manufacturing of CNT Template

Figure 2A:
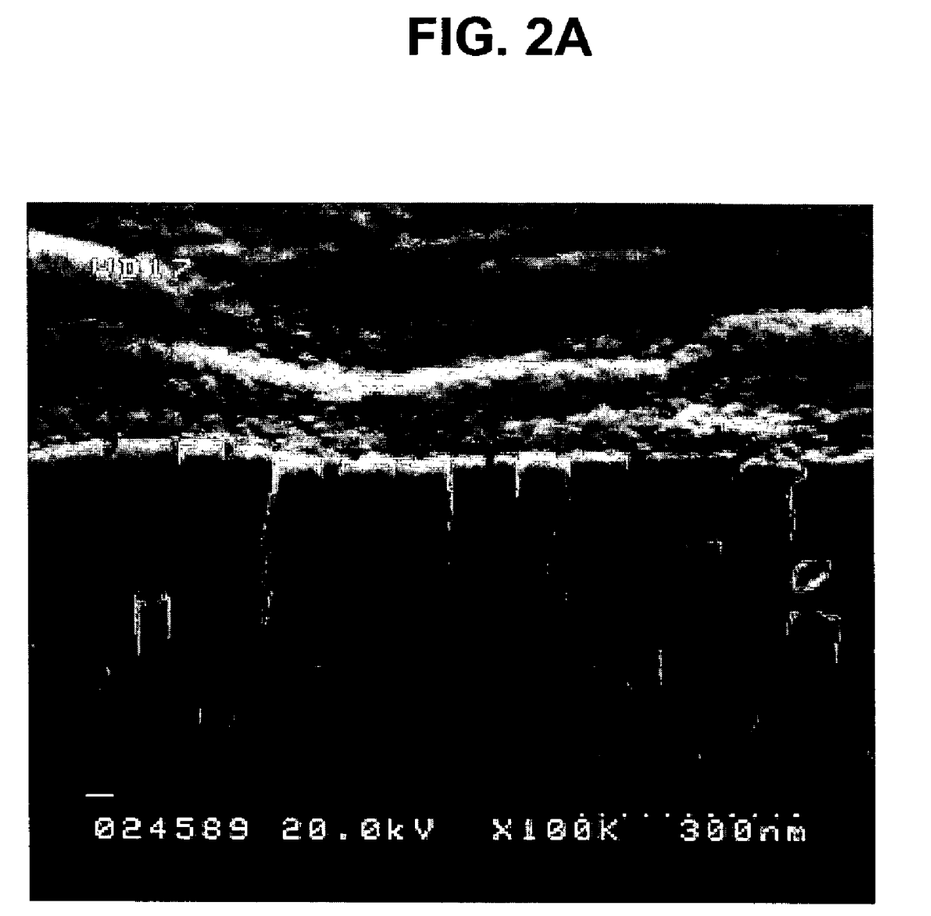
FIG. 2A is a scanning electron microscope (SEM) photograph showing an elevational view of a vertical structure of a carbon nanotube (CNT) array formed on porous alumina.
Figure 2B:
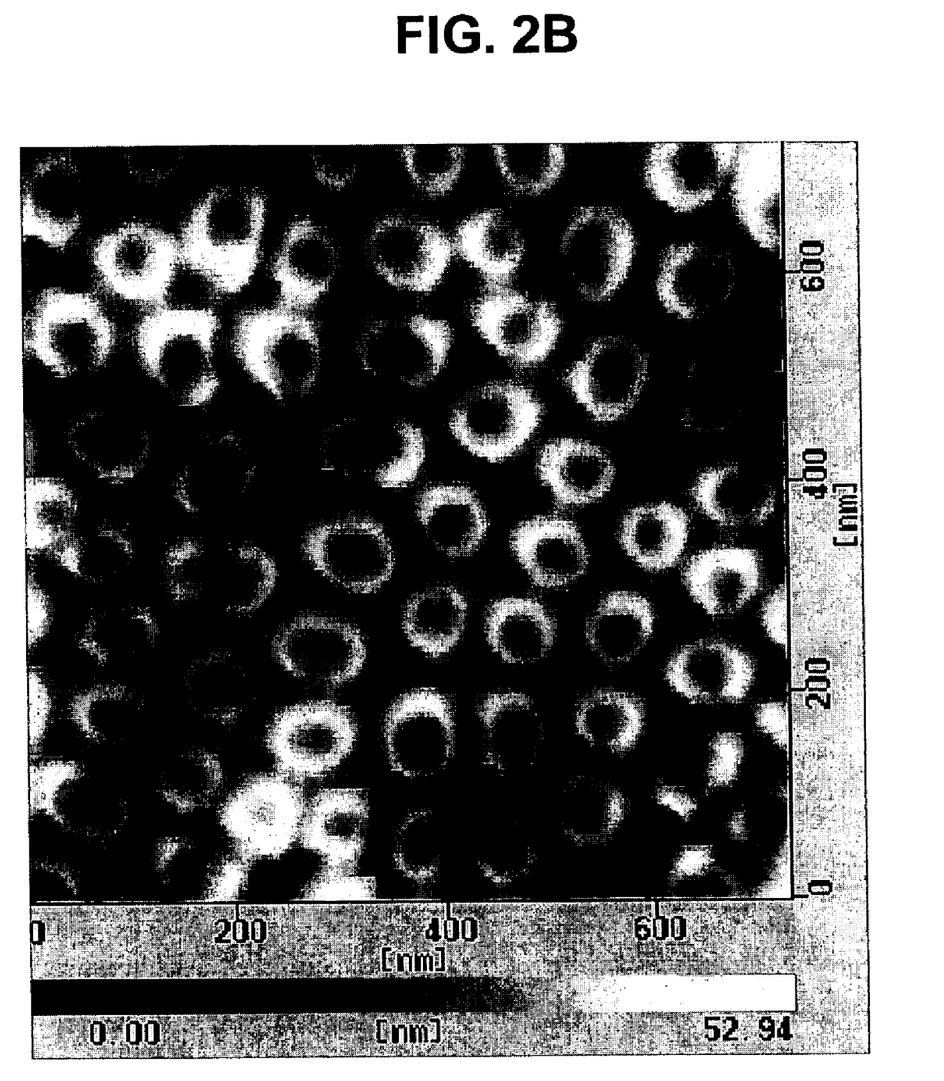
FIG. 2B is a dynamic force microscope (DFM) photograph showing a plan view of a structure of a CNT array formed on porous alumina.

An Al thin film having a thickness of 500 nm was formed on a Si wafer using a sputtering process and was then subject to cathodic oxidation in a 0.3 M oxalic acid solution at a temperature of 16° C. and a DC voltage of 40 V, and thereby forming porous alumina. Subsequently, the porous alumina was treated with 0.1 M phosphoric acid in order to expand the diameter of pores. Thereafter, CNTs were grown on the Si wafer in a tube furnace for 30 minutes at a temperature of about 700° C. with 10% acetylene and the balance $N_2$ gas. Graphite was removed from the grown CNTs using Ar ions milling at 50 W to thereby obtain a CNT array, as shown in FIGS. 2A and 2B. FIG. 2A is a scanning electron microscope (SEM) photograph showing a plan view of a vertical structure of an actual CNT array, and FIG. 2B is a dynamic force microscope (DFM) photograph showing a plan view of a structure of the CNT array.

Inorganic ALD on CNT Template

Inorganic nanotubes, i.e., Ru nanotubes according to an embodiment of the present invention, were formed on the surface of a CNT template by using ALD. The ALD conditions were the same as those used for testing ALD growth rate of Ru. Deposition of Ru was performed at a low temperature, for example, at 300° C., in order to suppress the decomposition of the CNT, thereby obtaining a Ru thin film having a thickness of 6 nm or less.

Figure 3A:
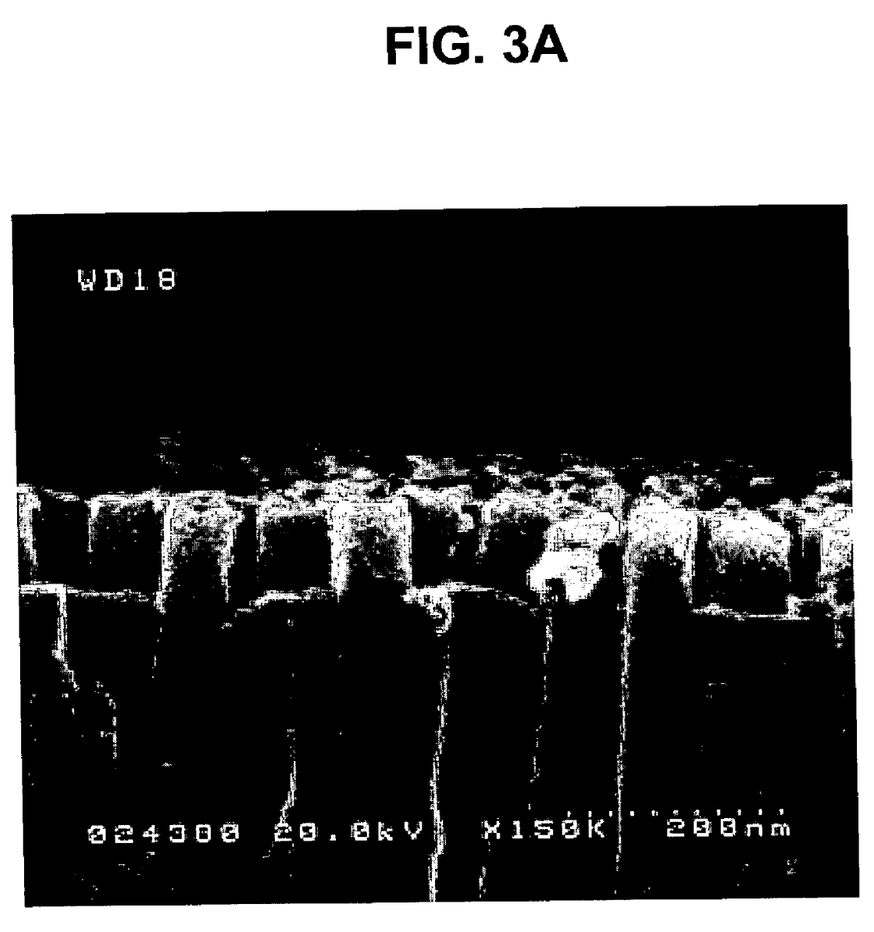
FIG. 3A is an SEM photograph showing an elevational view of a vertical structure of a Ru thin film formed on a CNT array according to an embodiment of the present invention.
Figure 3B:
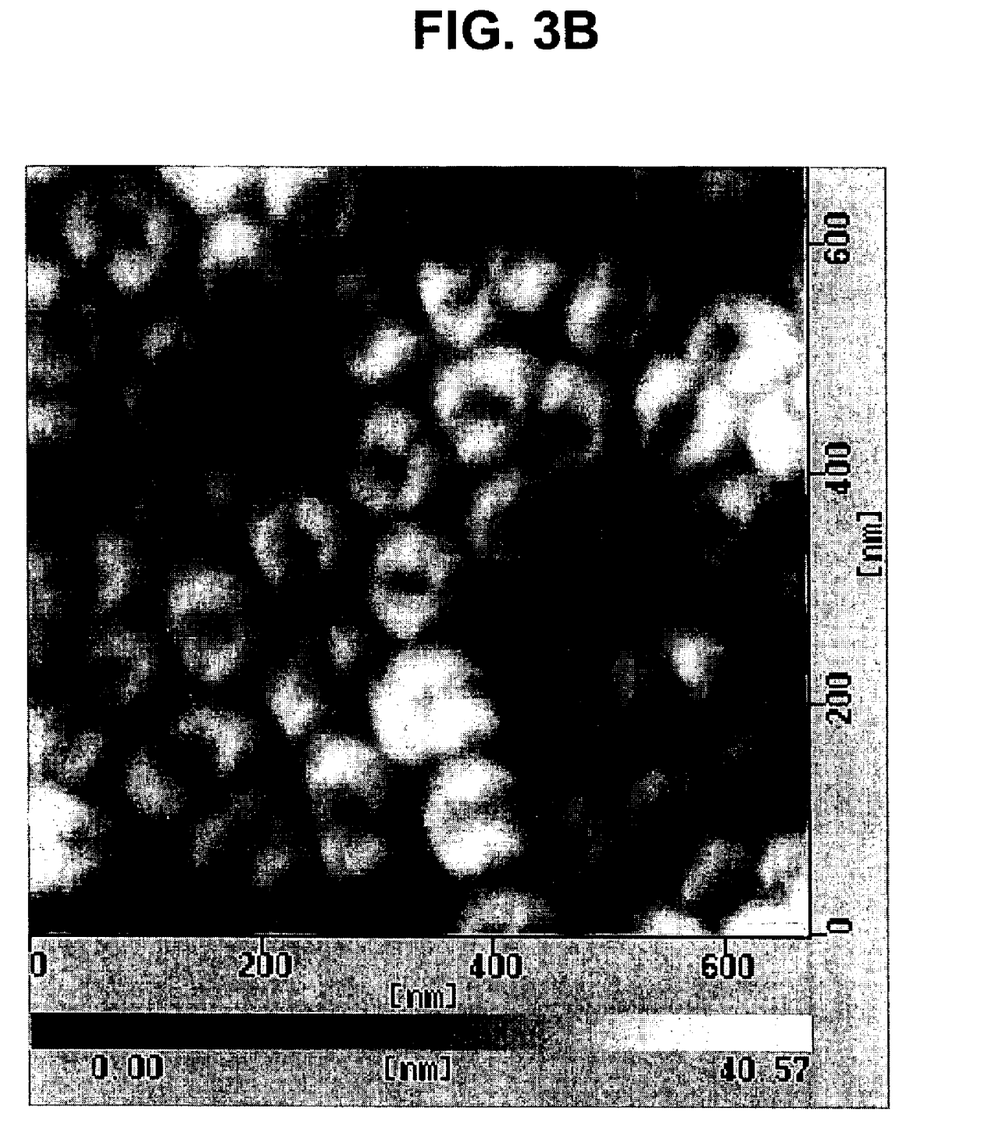
FIG. 3B is a DFM photograph showing a plan view of a structure of a Ru thin film formed on a CNT array according to an embodiment of the present invention.
Figure 3C:
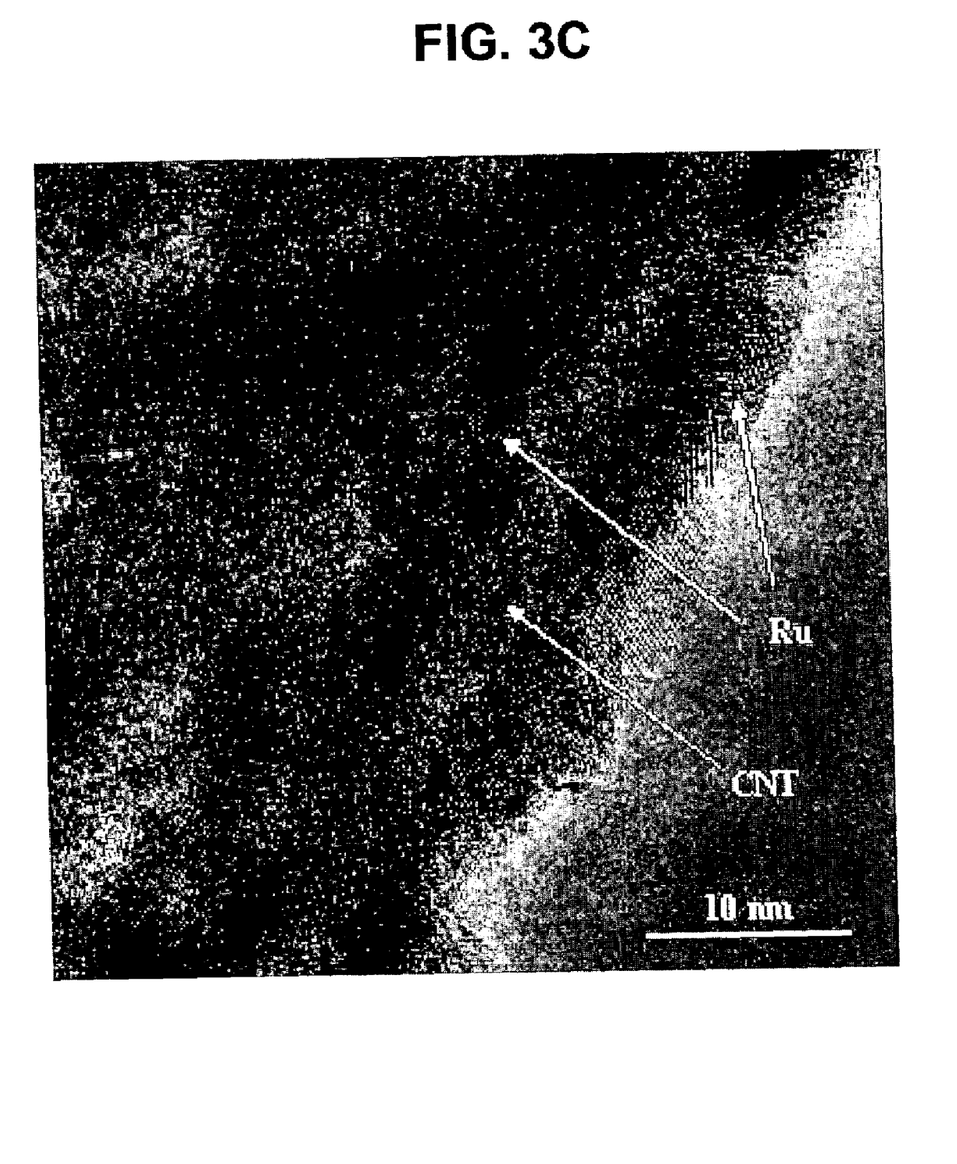
FIG. 3C is a high-resolution transmission electron microscope (TEM) photograph of a Ru thin film formed on a CNT array according to an embodiment of the present invention.
Figure 3D:
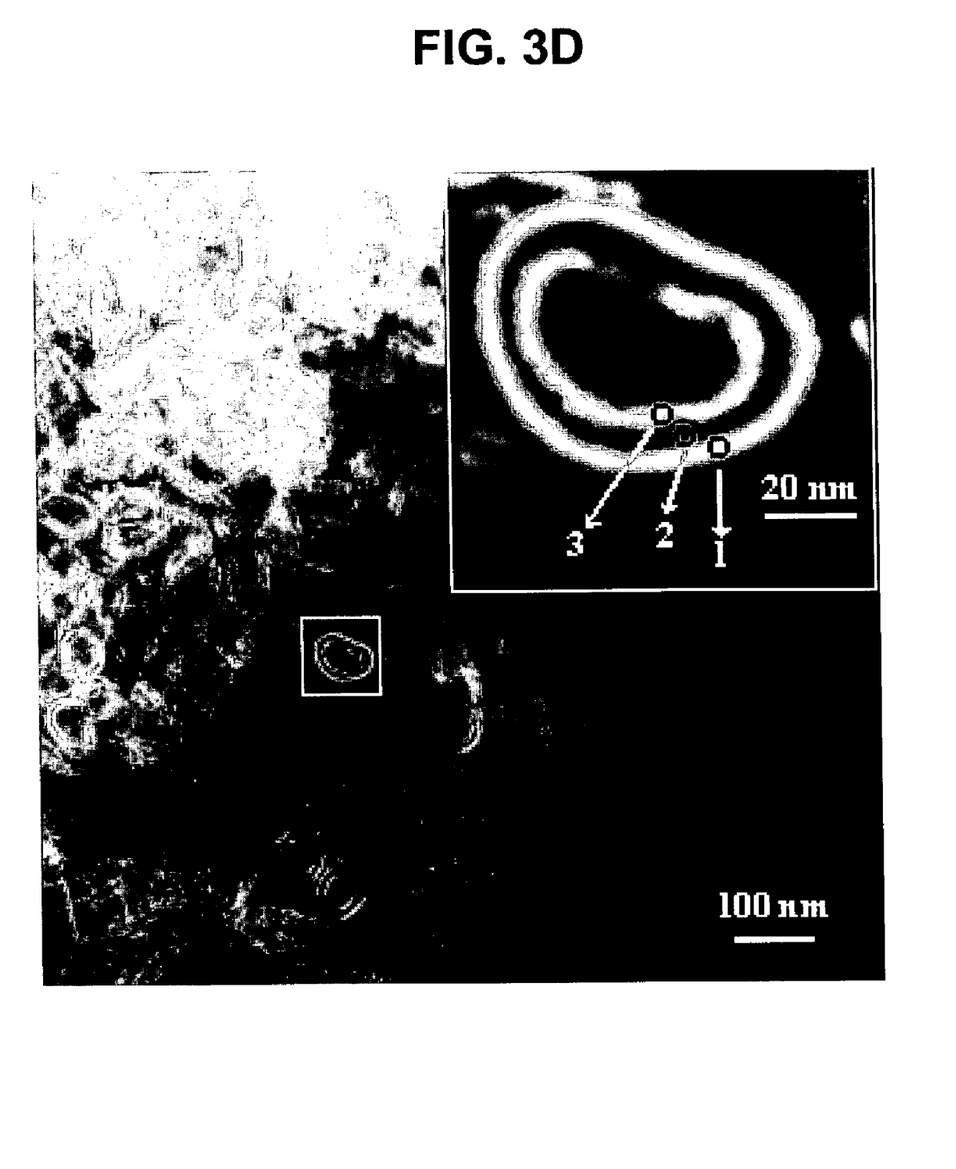
FIG. 3D is a Z-contrast image of a Ru thin film formed on a CNT array according to an embodiment of the present invention.

FIG. 3A is an SEM photograph showing an elevational view of a vertical structure of a Ru thin film using ALD, and FIG. 3B is a DFM photograph showing a plan view of a structure of the Ru thin film. In comparing FIG. 2B, showing the plan view of a structure of a pure CNT, and FIG. 3B, showing the plan view of a structure of the Ru thin film with which the CNT was coated, the inner diameter of the CNT was reduced due to the Ru thin film. FIG. 3C is a high-resolution transmission electron microscope (TEM) photograph of the Ru thin film. From FIG. 3C, it may be inferred that the Ru thin film on the CNT has a crystalline microstructure while the CNT template has an amorphous structure having many defects. A Z-contrast image of FIG. 3D shows that the micro-structure of the Ru thin film formed on the inner wall 3 of the CNT 2 is more sparse than the one formed on the outer wall 1 of the CNT 2.

Manufacturing of Inorganic Nanotube

After the Ru thin film was formed over the CNT array, ashing was performed for an hour at a pressure of about 1 torr and at a temperature of about 500° C. while oxygen is flushed at a rate of about 100 sccm in order to remove the CNTs below the Ru thin film and oxidize the Ru thin film to thereby form a RuOx tube array, i.e., an inorganic nanotube array.

Figure 4A:
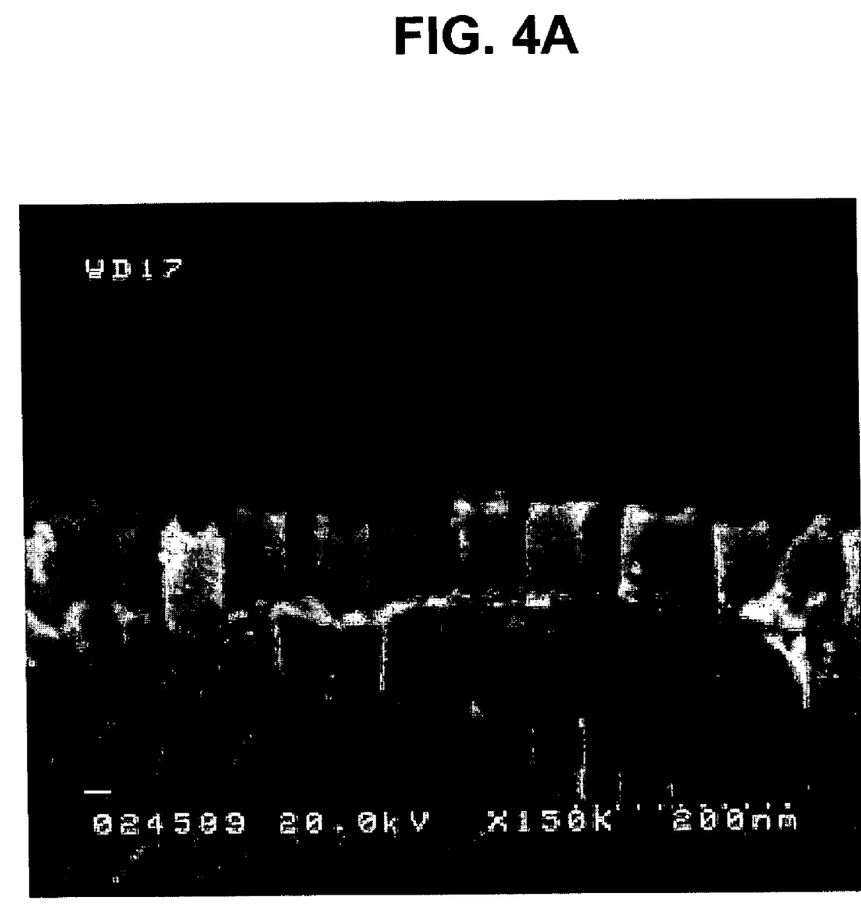
FIG. 4A is an SEM photograph showing an elevational view of a vertical structure of a RuOx nanotube manufactured according to an embodiment of the present invention.
Figure 4B:
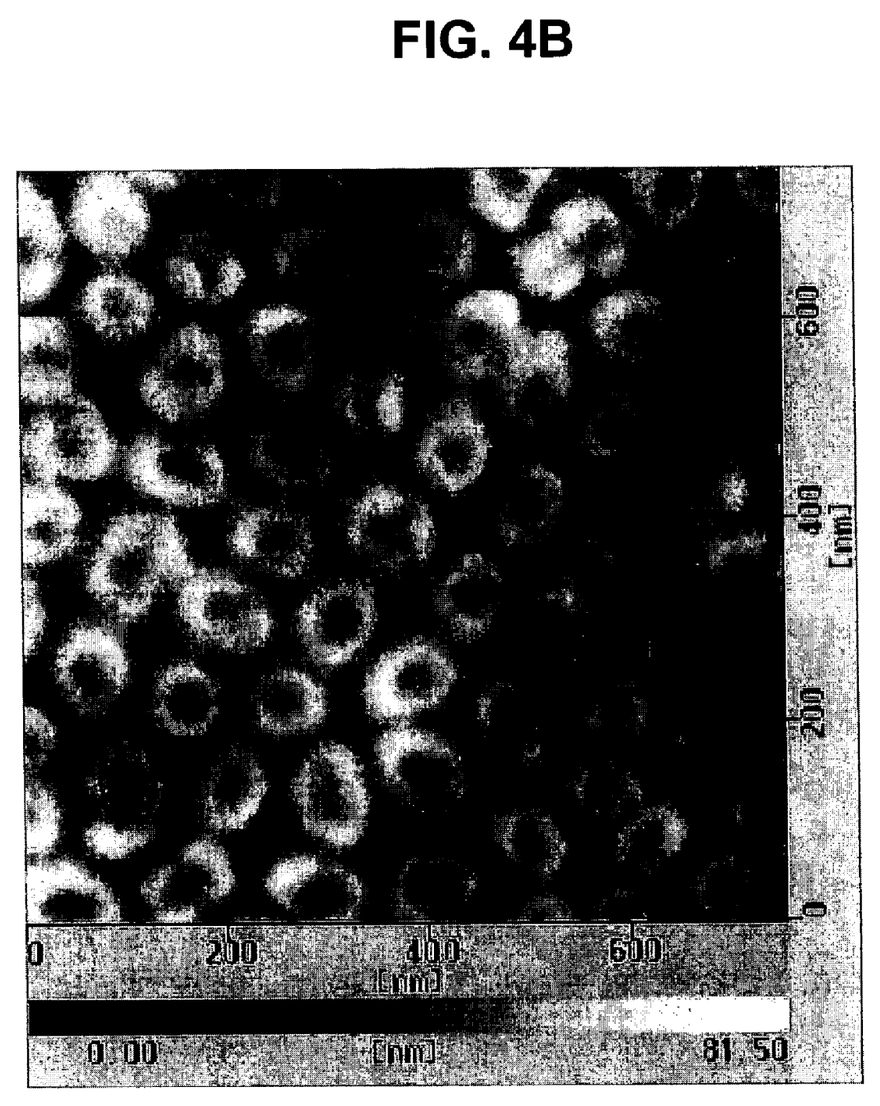
FIG. 4B is a DFM photograph showing a plan view of a structure of a RuOx nanotube manufactured according to an embodiment of the present invention.

FIG. 4A shows the alumina pores exposed by removing the CNTs by using an ashing process. FIG. 4B shows the slight expansion of the tubes after the CNTs (see FIG. 3B) were removed using the ashing process. The CNTs may also be removed using plasma instead of ashing, which accompanies oxidation.

Figure 4C:
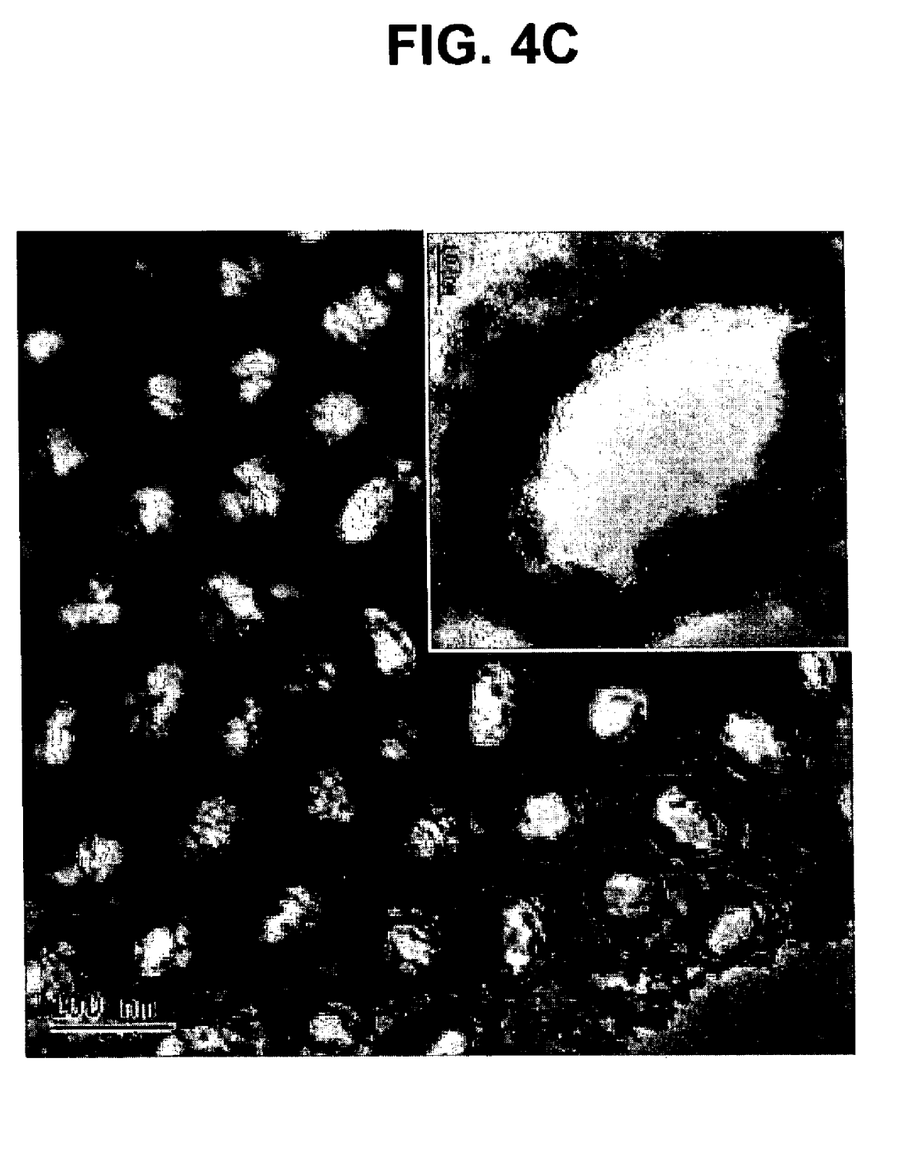
FIG. 4C is a high-resolution TEM photograph of a RuOx nanotube manufactured according to an embodiment of the present invention.
Figure 4D:
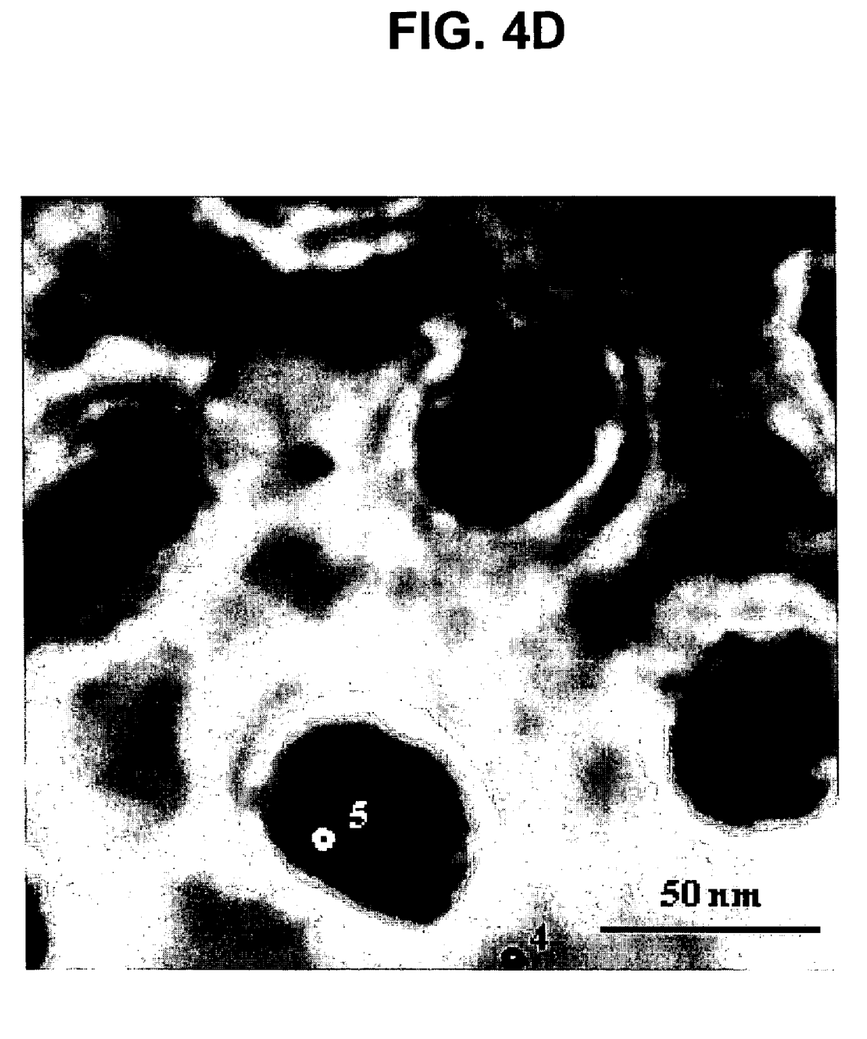
FIG. 4D is a Z-contrast image of a RuOx nanotube manufactured according to an embodiment of the present invention.

FIGS. 4C and 4D show that RuOx nanotubes were produced by removing the CNTs using the ashing process and simultaneously oxidizing the Ru thin film formed on the CNTs.

The following table shows the characteristic X-ray counts for each element as a result of performing transmission electron microscopy-energy dispersive spectroscopy (TEM-EDS). Positions on the Ru/CNT structure were position 1, on the outer wall 1 as shown in FIG. 3D; position 2, on the CNT template 2 as shown in FIG. 3D; and position 3, on the inner wall 3 as shown in FIG. 3D. Positions on the RuOx nanotube structure were position 4, on an alumina matrix as shown in FIG. 4D; and position 5, on a Ru nanotube shown in FIG. 4D. When the ratios of C/Ru at the positions 1, 2, and 3, in the Ru/CNT structure, are compared, it may be inferred that the outer wall 1 has a much finer structure than the inner wall 3. In the RuOx structure, carbon rarely appears since it has been ashed. In addition, since Ru has been oxidized into RuOx, a characteristic X-ray count for Al is smaller at position 5 than at position 4. Nevertheless, the oxygen count has not changed between positions 4 and 5 due to oxygen induced from RuOx.

TABLE

Results of TEM-EDS analysis on characteristic
X-ray peaks for each element

| | Ru/CNT | | | RuOx | |
|---|---|---|---|---|---|
| Element | Position 1 | Position 2 | Position 3 | Position 4 | Position 5 |
| C, K α (0.282 keV) | 32 | 117 | 64 | 12 | 22 |
| O, K α (0.523 keV) | — | 14 | 18 | 59 | 59 |
| Al, L α (1.487 keV) | — | — | — | 116 | 31 |
| Ru, K α (2.588 keV) | 110 | 33 | 116 | 8 | 99 |

In order to manufacture an inorganic nanotube through the above-described processes, the following conditions must be satisfied. First, the conditions of a precursor, a reaction gas, and deposition temperature must be fixed such that ALD of an inorganic thin film may be performed without decomposing a CNT. Second, during ALD, a channel allowing CNT to be ashed as a result of difference in deposition behavior between the outer wall and the inner wall of the CNT must be provided. However, depending on the purpose of the application of a nanotube, a CNT coated with an inorganic thin film may be used, instead of removing the CNT through ashing.

The present invention provides a method of manufacturing a CNT coated with an inorganic thin film by coating the CNT or a CNT array with an inorganic thin film using ALD while allowing a second inorganic nanotube to be manufactured by removing the CNT with high-temperature ashing. Since the present invention does not adopt a reaction restricted to a particular material, the present invention may be applied to any case of manufacturing an inorganic nanotube using a precursor for ALD on a CNT. In addition, the present invention is compatible with other micro processing technology such as semiconductor device manufacturing. Moreover, inorganic nanotubes having various shapes may be produced in various arrays using ALD, and inorganic nanotubes in systematic array may also be easily manufactured without performing a separate etching process. Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing an inorganic nanotube, comprising:
   preparing a template on which a carbon nanotube (CNT) or a CNT array is formed;
   forming a ruthenium (Ru) thin film on the CNT by depositing ruthenium on the template using atomic layer deposition (ALD) at a temperature below 300° C.; and
   removing the CNT to obtain a ruthenium nanotube or ruthenium nanotube array.

2. The method as claimed in claim 1, wherein preparing the template comprises:
   forming a porous material layer on a substrate; and
   growing a CNT from a pore in the porous material layer.

3. The method as claimed in claim 2, wherein the porous material layer is a porous alumina layer.

4. The method as claimed in claim 2, wherein forming the porous material layer comprises:
   forming an aluminum thin film on the substrate; and
   oxidizing the aluminum thin film to form a porous alumina layer.

5. The method as claimed in claim 3, wherein forming the porous material layer comprises:
   forming an aluminum thin film on the substrate; and
   oxidizing the aluminum thin film to form the porous alumina layer.

6. The method as claimed in claim 1, wherein removing the CNT comprises ashing and oxidizing the ruthenium thin film while supplying oxygen or ozone.

7. The method as claimed in claim 2, wherein removing the CNT comprises ashing and oxidizing the ruthenium thin film while supplying oxygen or ozone.

8. The method as claimed in claim 3, wherein removing the CNT comprises ashing and oxidizing the ruthenium thin film while supplying oxygen or ozone.

9. The method as claimed in claim 1, wherein removing the CNT comprises etching using plasma.

10. The method as claimed in claim 2, wherein removing the CNT comprises etching using plasma.

11. The method as claimed in claim 3, wherein removing the CNT comprises etching using plasma.

* * * * *